United States Patent [19]

Frankeny et al.

[11] Patent Number: 5,222,012

[45] Date of Patent: Jun. 22, 1993

[54] POWER MANAGEMENT CIRCUIT FOR A MAGNETIC REPULSION PUNCH

[75] Inventors: Richard F. Frankeny, Austin; Jerome A. Frankeny, Taylor; Thai Q. Ngo, Austin, all of Tex.

[73] Assignee: International Business Machines Corporation, Armonk, N.Y.

[21] Appl. No.: 642,504

[22] Filed: Jan. 17, 1991

[51] Int. Cl.[5] .................. B26D 5/08; H01H 47/32
[52] U.S. Cl. .................. 361/156; 83/76.1; 83/575; 361/169.1
[58] Field of Search .......... 361/155, 156, 152, 143, 361/166, 169.1, 153, 168.1, 209, 154; 307/38, 39, 41; 425/3; 83/76.1, 577, 575

[56] References Cited

U.S. PATENT DOCUMENTS

| | | | |
|---|---|---|---|
| 3,684,983 | 8/1972 | Cotter et al. | 307/262 |
| 3,730,039 | 5/1973 | Fedrigo | 83/170 |
| 3,982,173 | 9/1976 | Berry et al. | 361/18 |
| 4,000,673 | 1/1977 | Lyon | 83/526 |
| 4,008,021 | 2/1987 | Fedrigo et al. | 425/3 |
| 4,410,926 | 10/1983 | Hafner et al. | 361/95 |
| 4,421,000 | 12/1983 | Murphy | 83/372 |
| 4,472,755 | 9/1984 | Praeg | 361/156 |
| 4,607,311 | 8/1986 | Brown et al. | 361/155 |
| 4,757,419 | 7/1988 | Masaki | 361/156 |
| 4,872,381 | 10/1989 | Stroms | 83/76.1 |

FOREIGN PATENT DOCUMENTS 2003276A 5/1980 United Kingdom .

Primary Examiner—A. D. Pellinen
Assistant Examiner—Richard T. Elms
Attorney, Agent, or Firm—Lisa L. B. Yociss; Andrew J. Dillon

[57] ABSTRACT

A power management circuit for operating a magnetic repulsion punch comprising a storage capacitor arranged to be connected in parallel with an inductive load serving as an operating coil of the magnetic repulsion punch, a means for selectively and temporarily coupling the inductive load to the storage capacitor for forming a resonant circuit, and a means for charging the storage capacitor after each operation.

6 Claims, 2 Drawing Sheets

POWER MANAGEMENT CIRCUIT FOR A MAGNETIC REPULSION PUNCH

BACKGROUND OF THE INVENTION

1. Technical Field

The present invention relates generally to machinery for punching holes and more particularly to the field of electric circuitry for operating magnetic repulsion punches. Still more particularly the present invention relates to the use of a resonant circuit for creating an electromotive force utilizing the coil of a magnetic repulsion punch to provide the impulse to operate such a punch.

2. Description of the Related Art

Magnetic repulsion punches historically have been utilized for multiple operations for punching holes in flat plates such as printed circuit boards. Repetitive operation of such devices generally requires that a magnetic punch be operated by a triggering or switching system that repeatedly directs electricity through the coil of the magnetic punch at the proper time. Switching systems in recent prior art systems have required the use of very large power transistors which supply a high current pulse directly to the coil of a magnetic repulsion punch. Control of this operation is generally provided through a logic control input to the gate of the transistor.

This known method of providing and controlling the application of power to a magnetic punch demands large and very expensive transistors and generates large quantities of waste heat. Not only do such high heat losses waste energy, but transistors capable of handling the high currents necessary to operate some magnetic punches are scarce and frequently very expensive.

SUMMARY OF THE INVENTION

Accordingly, it is one object of the present invention to provide an economical and efficient means for operating a magnetic repulsion punch.

It is another object of the present invention to provide a means of operating a magnetic punch that does not require the use of large power transistors.

It is yet another object of this invention to provide a resonant circuit utilizing a high efficiency storage capacitor which resonates with an inductive coil of a magnetic repulsion punch to provide the power for operation of the magnetic repulsion punch.

It is another object of the present invention to significantly reduce the size of an array of multiple magnetic repulsion punches to permit the array to be utilized to punch multiple closely spaced holes in a rapidly timed operation.

It is another object of this invention to provide a means for operating multiple magnetic punches from a single high efficiency storage capacitor by selectively coupling each magnetic repulsion punch coil to the storage capacitor in a time sequence.

It is yet another object of this invention to provide a charging circuit capable of charging a storage capacitor to alternating polarities for operating a magnetic repulsion punch.

The foregoing objects are achieved as is now described. The present invention of a power management circuit comprises a single, high efficiency storage capacitor located proximate to the operating coil of at least one magnetic repulsion punch. The operating coil is selectively and temporarily coupled to the storage capacitor. Such an arrangement eliminates the necessity of a high resistance current path from a remote storage capacitor location. The resulting resonant circuit produces a rapid sinusoidal current rise when the circuit is completed, thus providing the necessary electromotive force to operate the coil without the use of large power transistors. The solid state coupling circuit disclosed as a control system utilizes one or more silicon controlled rectifiers (SCRs) in series with the operating coil that may be rendered conductive by external triggering circuitry, thereby completing the resonant circuit.

Further, the use of a single storage capacitor for multiple magnetic repulsion punches permits significant reduction in the size of an array of such magnetic repulsion punches. Rather than providing a power transistor or storage capacitor for each punch, multiple punches may be selectively coupled to the storage capacitor in timed sequence.

A charging circuit for the storage capacitor may recharge the storage capacitor after each operation at a slower speed than the speed of operation of the resonant circuit and therefore may operate at a much lower recharging current than the discharge current of the resonant circuit. Consequently, the charging power supply may be located remote from the storage capacitor without incurring excessive energy losses in the circuit path from the charging power supply to the storage capacitor and without requiring large conductors in the charging circuit. The power supply itself, though rectified, need not be regulated due to the relative insensitivity of a storage capacitor to minor voltage fluctuations in the output of a rectified power supply.

Finally, the storage capacitor may be operated in a bipolar mode to achieve significant reductions in energy consumption. During discharge, a resonant circuit experiences a high sinusoidal current rise. When the current reverses direction, the conducting SCR will turn itself off by ceasing to conduct, thereby leaving transferred charge on the opposite leg of the storage capacitor. The energy remaining on the capacitor is given by the equation:

$$E = \tfrac{1}{2} C V^2$$

where
- E = energy on the capacitor
- C = capacitance
- V = voltage on the capacitor.

In a preferred mode of the present invention, the capacitor will be charged to approximately 200 volts initially. After discharge, the capacitor typically will retain 140 volts at opposite (negative) polarity. In the monopolar mode, this 140 volts must be reduced to zero and then the storage capacitor charged from the power supply to a full 200 volts of positive polarity If the 140 volts of remaining charge were utilized, requiring only that the voltage be increased to 200 volts negative polarity, the recharge step would require only an additional 60 volts and the energy savings would be described by the following equation:

$$P_x = C(V_x)^2 f$$

where
- $V_x$ = Voltage X to be built up on capacitor C.
- $P_x$ = power requirement to build up $V_x$
- f = frequency Thus:

$$P_1 = CV_1^2 f = C(200)^2 f$$

$$P_2 = CV_2^2 f = C(140)^2 f$$

Consequently, the power savings is:

$$\frac{P_1 - P_2}{P_1} = \frac{C(200^2 - 140^2)f}{C(200^2)f}$$

or approximately equal to ½, indicating a reduction in the charging power requirement by a factor of approximately four.

To achieve this savings, two separate charging and coupling circuits are required. Consequently, the following detailed description of a preferred embodiment discusses operation of the invention in the bipolar mode. It will be obvious to one skilled in the art, however, and it is within the spirit of the present invention, to operate the invention in the monopolar mode. Whereas the bipolar mode requires two charging circuits and two solid state coupling circuits with corresponding balanced triggering circuits for each inductive load, a monopolar operating mode would require but one charging circuit and a single coupling and triggering circuit for each inductive load, but would also require a means for discharging the unused energy on the negative leg of the capacitor.

DESCRIPTION OF THE DRAWINGS

The novel features believed characteristic of the invention are set forth in the appended claims. The invention itself, however, as well as a preferred mode of use and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
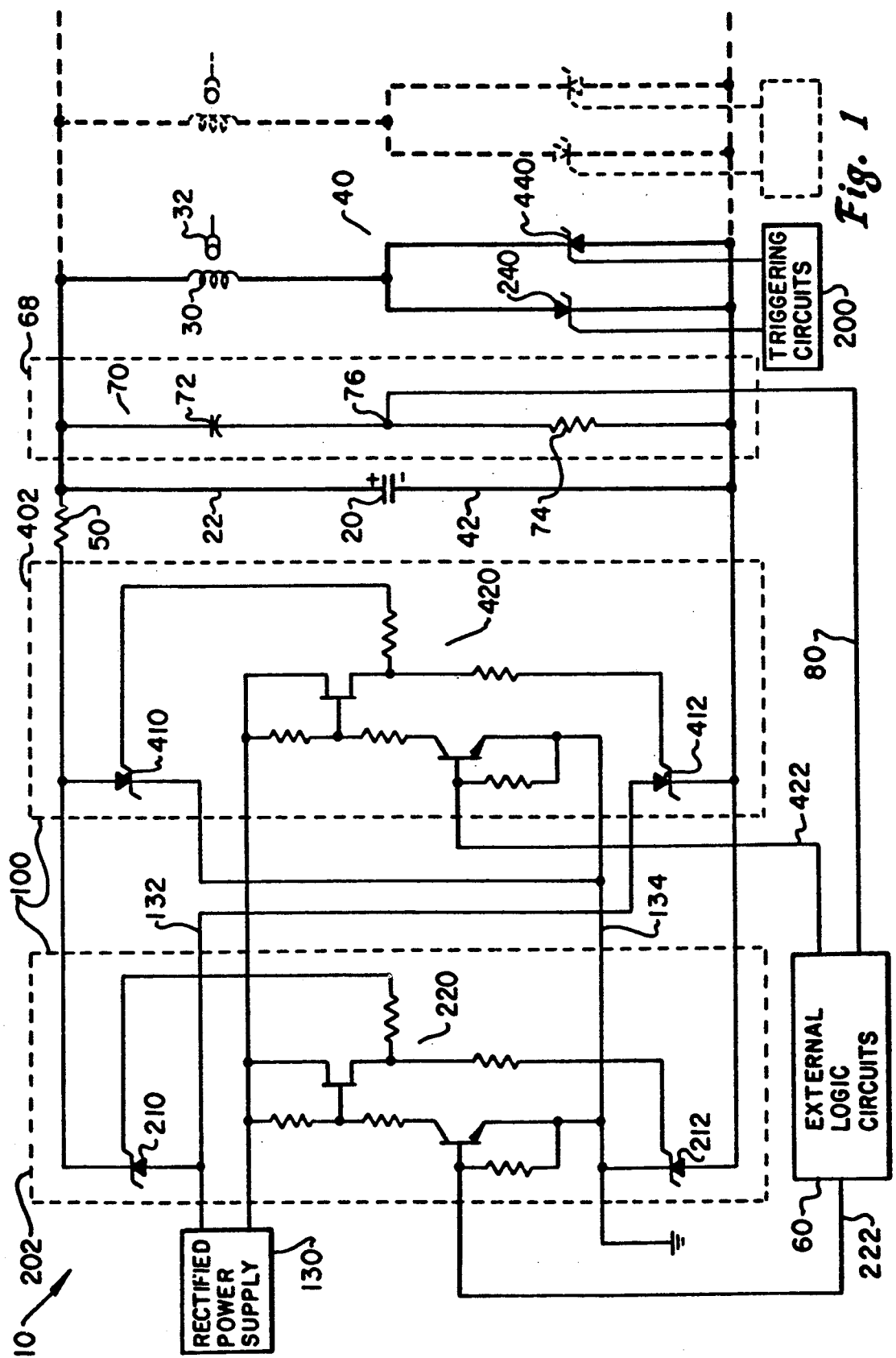
FIG. 1 is a schematic representation of a bipolar magnetic repulsion punch power management circuit comprising a storage capacitor in parallel with a plurality of inductive coils and further detailing the charging circuit for the storage capacitor.

Referring now to the figures, wherein the referenced numerals designate the same or identical parts throughout the several views, and particularly to FIG. 1, the present invention is shown as a power management circuit 10 comprising a storage capacitor 20 connected in parallel with an inductive load 30 to form a resonant circuit. A coupling circuit 40 comprising a pair of silicon controlled rectifiers (SCRs) 240 and 440 connected in polarity opposite to each other and connected in series with the inductive load. The balanced triggering circuits 200 for causing one of the SCRs to conduct are shown in block diagram and are further shown in detail on FIG. 2.

Continuing with FIG. 1, a means 100 for charging the storage capacitor 20 is shown as two charging circuits 202 and 402 in dashed blocked lines. Each comprises SCR pairs 210 and 212 or 410 and 412, respectively, operated by control circuits 220 or 420, respectively, that connect one leg of the storage capacitor 20 to a rectified power supply 130 through a charging bus 132 and connect the opposite leg of the storage capacitor to ground through a grounding bus 134. The control circuits 220 and 420 operate in response to control signals 222 and 422, which cause control circuits 220 and 420, according to their polarity, to charge the storage capacitor 20 to either a positive or negative voltage. For example, if charging circuit 202 is selected by control signal 222, then the energy from the rectified power supply 130 will be directed from the charging bus 132 through SCR pair 210 and 212 to the positive leg 22 of the storage capacitor 20 to charge the storage capacitor 20 to a positive voltage If charging circuit 402 is selected by control signal 422, then the energy from the rectified power supply 130 will be directed through SCR pair 410 and 412 to the negative leg 42 of the storage capacitor 20 to charge the storage capacitor 20 to a negative voltage.

In either case, an impedance means 50 connected in series between the rectified power supply 130 and the storage capacitor 20 as directed by the charging circuits 202 and 402 serves to limit the current according to the needs of the physical layout of the circuitry. The size of the impedance means 50 would be selected to optimize the conductor size and losses in the current path between the rectified power supply 130 and the storage capacitor 20 according to their locations relative to each other, the frequency of discharges and the speed at which recharge must occur.

Figure 2:
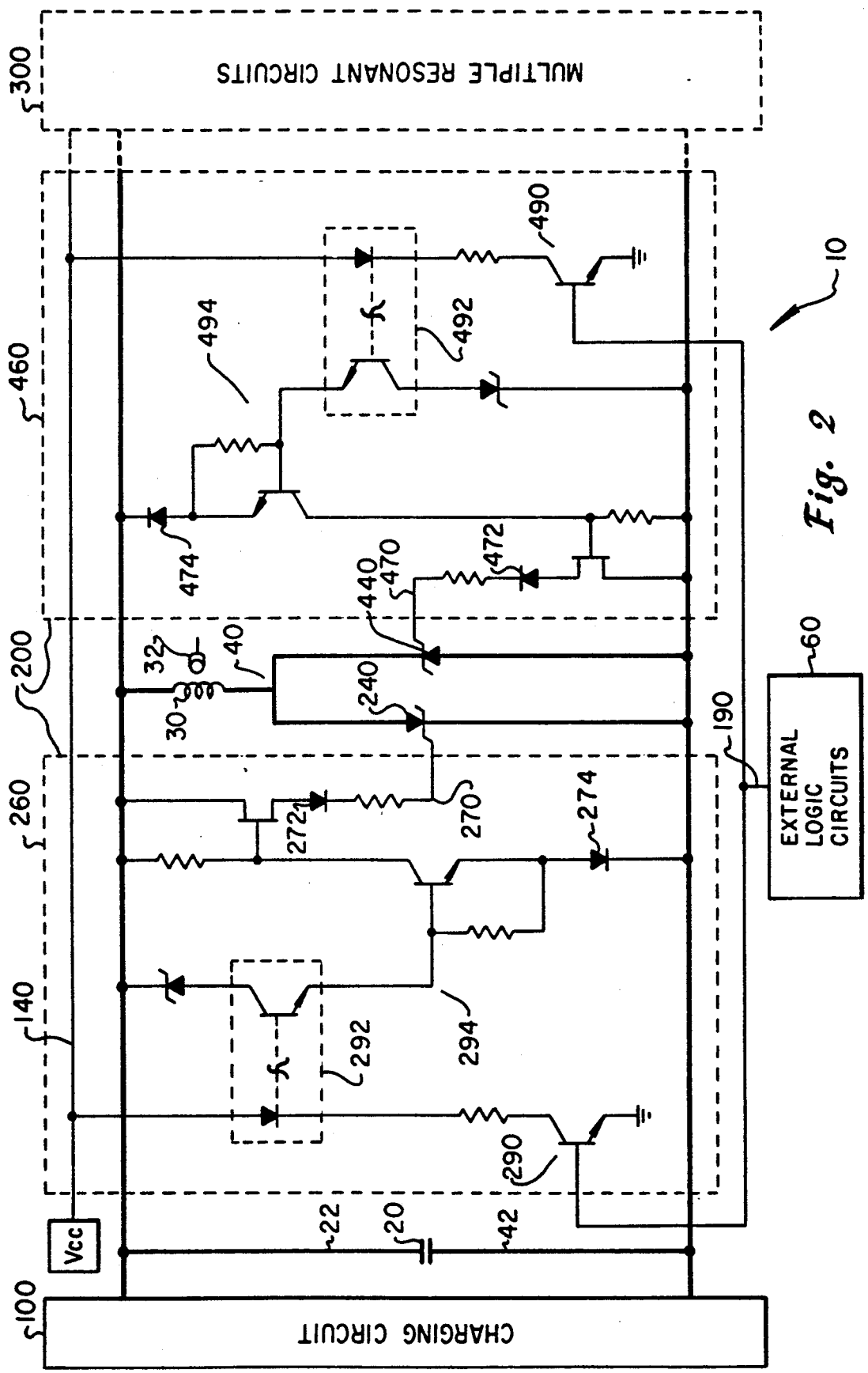
FIG. 2 is a schematic representation of the storage capacitor and plurality of inductive coils shown in FIG. 1 and further details the balanced triggering circuits which complete the resonant circuit.

Referring now to FIG. 2 and more specifically to the details of a pair of balanced triggering circuits 200 of the coupling SCRs 240 and 440, it can be seen that the two triggering circuits 260 and 460 each contain triggering signal paths 270 and 470 that operate the respective coupling SCRs 240 and 440. Two enabling circuits 290 and 490, each powered by a low voltage source 140, are coupled through optical coupling transistors 292 and 492 to operating circuits 294 and 494 respectively, of which operating circuits 294 and 494 in turn emit triggering signals through the triggering signal paths 270 and 470.

For each resonant circuit, comprising the storage capacitor 20 and one of a plurality of inductive loads 30, there will be a coupling circuit 40 comprising a pair of coupling SCRs 240 and 440 controlled by these balanced triggering circuits 200. The present invention contemplates arrangement of multiple such resonant circuits into a closely spaced array (not shown) by including a plurality of the arrangements shown in FIG. 2, each comprising an inductive load 30 and two coupling SCRs 240 and 440 with their respective triggering circuits 260 and 460, all connected to the said storage capacitor 20 These multiple resonant circuits are shown in phantom in FIG. 1 and in phantom block in FIG. 2.

In operating circuits 294 and 494 can be seen isolating means 272, 274, 472 and 474, comprising in the illustrated embodiment isolating diodes, for preventing backfeed when the capacitor 20 is charged to the opposite polarity from that polarity at which the selected triggering circuit 260 or 460 operates. For example, if storage capacitor 20 is charged positively, then the isolating diodes 472 and 474 in triggering circuit 460 are reverse biased and prevent the positive charge of the storage capacitor 20 from affecting the triggering circuit 460 or the charge on the negative capacitor leg 42. When storage capacitor 20 is negatively charged, then triggering circuit 260 likewise will be isolated by isolating diodes 272 and 274 from what, to it, would be a reverse bias.

The balanced nature of these balanced triggering circuits 200 is demonstrated by the fact that the same enabling signal 190 is applied to both triggering circuits 260 and 460 at the same time. Consequently, through this enabling signal 190 both triggering circuits 260 and 460 are activated simultaneously. However, only one will operate because of the isolating diodes 272 and 274 or 472 and 474.

A sensing means 68 comprising a non-insertion sensing circuit 70 is shown in FIG. 1. This circuit comprises a sensing capacitor 72 that is substantially smaller than the storage capacitor 20 so that, upon completion of the resonant circuit, contribution of the sensing capacitor 72 to the current through the inductive load 30 will be de minimus, but the sensing capacitor 72 current will be proportional to the current flowing out of the storage capacitor 20. Since the storage capacitor 20 completely discharges during the first half cycle of operation, the discharge current will be:

$$I_s = -C_s dV_{cs}/dt$$

where
- $I_s$ = discharge current of storage capacitor 20
- $C_s$ = capacitance of the storage capacitor 20
- $V_{cs}$ = Voltage of storage capacitor 20. Since the sensing capacitor 72 is selected to be substantially smaller than the storage capacitor 20, $$I_{ss} = -C_{ss} dV_{cs}/dt$$

and $$I_s = (C_s/C_{ss})I_{ss}$$

where
- $I_{ss}$ = current through sensing capacitor 72
- $C_{ss}$ = capacitance of sensing capacitor 72.

The current flowing through this sensing capacitor 72 also flows through a biasing resistor 74, causing a voltage drop between a sensing terminal 76 and the negative leg 42 of the storage capacitor 20. Thus, this voltage may be used to sense the discharge current:

$$V_R = I_{ss} R = (C_{ss}/C_s) R I_s$$

where
- $V_R$ = voltage across biasing resistor 74
- $R$ = resistance value of biasing resistor 74.

The value R of the biasing resistor 74 may be selected according to the desired scale factor for metering the discharge current of storage capacitor 20:
If $$C_s/C_{ss} = n,$$

$$R = n(R_w + R_C)$$

where
- $R_w$ = wire resistance of connecting leads to storage capacitor 20, and
- $R_C$ = Equivalent Series Resistance of storage capacitor 20

Thus:

$$I_{ss} = I_s/n$$

This non-insertion sensing circuit 70 may be used for control purposes. When the storage capacitor 20 has reached full charge in either polarity, the voltage across the biasing resistor 74 will approach zero because the current through the sensing circuit 70 will approach zero. At a predetermined threshold voltage at the sensing terminal 76 selected by means of external logic circuits (shown in block diagram), triggering signal can be sent to the appropriate coupling SCR 240 or 440 through the balanced triggering circuits 200 of the selectively coupled inductive load 30 to operate the corresponding magnetic repulsion punch 32.

In operation the storage capacitor 20 will be charged by one of the charging circuits 202 and 402 shown in FIG. 1. Taking the positive state of charge as the initial condition for purposes of this discussion, charging circuit 202 will have charged the storage capacitor 20 to a positive charge through impedance means 50. When the storage capacitor 20 reaches a predetermined voltage, this state will be detectable using the sensing circuit 70, as described supra, or through some other means to detect full charge. The control signal 222 to charging circuit 202 will have been removed, turning off SCR pair 210 and 212 and decoupling the charging circuit 202 from the now fully charged storage capacitor 20.

Since the storage capacitor 20 is positively charged at this stage (i.e. the charge built up on the positive leg 22), when enabling signal 190 selects paired triggering circuits 200, triggering circuit 260 will cause coupling SCR 240 to conduct, thereby creating a resonant circuit through inductive coil 30 and coupling SCR 240 to discharge a high amplitude current pulse from the storage capacitor 20, operating the magnetic repulsion punch 32. When the high amplitude current pulse completes one half cycle and attempts to reverse current direction, then coupling SCR 240 will cease conducting, thereby decoupling the inductive load 30 from the storage capacitor 20 and opening the current path of the resonant circuit.

At this juncture, the storage capacitor 20 will have completely discharged from its positive leg 22 and will be negatively charged relative to the positive charging bus 132. In other words, the energy initially stored on the positive leg 22 of the storage capacitor 20 but remaining unused by the operation of the magnetic repulsion punch 32 will have transferred to the negative leg 42 of the storage capacitor 20 in the form of discharge current through the inductive load 30 and coupling SCR 240. The discharge current will have dropped to zero and the sensing means 68 will inform external logic circuits 60 peripheral to this invention by way of sensing signal path 80 to select the alternate charging circuit 402 utilizing control signal 422. This control signal 422 will cause charging circuit 402 to connect rectified power supply 130, through charging bus 132 and the pair of charging SCRs 410 and 412, to the negative leg 42 of the storage capacitor 20 to contribute additional charge to the negative leg 42 of the storage capacitor 20 until a predetermined threshold voltage is achieved, thereby readying the storage capacitor 20 for operation at the opposite polarity from its previous operation.

The charging process can be turned off by external logic circuits 60 dropping the control signal 422 to charging circuit 402, decoupling the charging circuit 402 from the storage capacitor 20. An enabling signal 190 can then be sent to the balanced triggering circuits 200. This time, because the storage capacitor 20 is negatively charged, both balanced triggering circuits 200 will operate, but only triggering circuit 460 will conduct through its triggering signal path 470 to cause coupling SCR 440 to begin conducting. Triggering circuit 260 will be blocked from conducting by the reverse bias on its isolating diodes 272 and 274. Coupling SCR 440 will complete the resonant circuit through the inductive load 30 with now negatively charged storage capacitor 20, thereby triggering a high amplitude current pulse through the inductive load 30 of the magnetic repulsion punch 32. Again, when this high amplitude current pulse completes one-half cycle and attempts to switch directions to flow back in the opposite direction, coupling SCR 440 will cease to conduct, thereby decoupling the inductive load 30 from the storage capacitor 20. The storage capacitor 20 will retain the energy unused by operation of the magnetic repulsion punch 32 and will be poised for recharging to a positive full voltage by charging circuit 202.

The present invention has been shown in only one of its forms. It should be apparent to those skilled in the art that it is not so limited but is susceptible to various changes and modifications without departing from the spirit thereof. For example, as discussed above, it is not necessary that the present invention be operated in a bipolar mode. It could, in fact, be operated through a single charging circuit (not shown) to charge the storage capacitor 20 in only the positive polarity. The bipolar mode is preferred, however, because of the energy savings derived from retaining and using the unused charge in the next operation rather than disposing of it through a fly back circuit or by other non-useful means.

As another example, field effect transistors (FETs) could be used in lieu of the coupling SCRs 240 and 440 to comprise the coupling circuit 40. Likewise, the isolating means could be achieved utilizing FETs. Also, other impedance devices than resistors could be used for the impedance means 50.

Obviously other modifications and variations of this invention are possible in light of the foregoing teachings. It is therefore understood that within the scope of the appended claims, the invention may be practiced otherwise than as specifically described.

I claim:

1. A bipolar power management circuit for operating at least one magnetic repulsion punch comprising:
a storage capacitor;
means for charging said storage capacitor in alternating polarities, including:
  a rectified power supply;
  a pair of charging circuits, each coupled in series with said storage capacitor and said rectified power supply and coupled in parallel with each other and in polarity opposite to the polarity of the other of said charging circuits by a pair of SCRs for each charging circuit, each SCR of said pair of SCRs coupled in series with one leg of said storage capacitor and having like polarity to each other, each pair of SCRs further having polarity opposite that of said pair of SCRs for the other of said charging circuits; and
  a control circuit for each pair of SCRs in said charging circuits for causing said SCRs in a selected one of said charging circuits to conduct in response to a control signal for charging said storage capacitor to alternating polarities;
at least one inductive load comprising an operating coil of said magnetic repulsion punch; and
means for selectively and temporarily coupling each said inductive load to said storage capacitor for forming a resonant circuit between said storage capacitor and said inductive load wherein a high amplitude current pulse is generated in said resonant circuit for operating said magnetic repulsion punch.

2. The bipolar power management circuit according to claim 1 for operating at least one magnetic repulsion punch wherein said means for selectively and temporarily coupling and decoupling said inductive load to said storage capacitor further comprises:
a pair of silicon controller rectifiers (SCRs) coupled manually in parallel and in opposite polarity to each other and together coupled in series with said inductive load;
a pair of balanced triggering circuits for said pair of SCRs for causing an SCR of appropriate polarity of said pair of SCRs to conduct, thereby forming said resonant circuit, causing said storage capacitor to discharge and current to flow in the resonant circuit and operating said magnetic repulsion punch.

3. The bipolar management circuit for operating at least one magnetic repulsion punch according to claim 1 and further providing:
sensing means for measuring current and voltage in said resonant circuit.

4. The bipolar management circuit for operating at least one magnetic repulsion punch according to claim 3 wherein said sensing means comprises a sensing circuit coupled in parallel with said storage capacitor, said sensing circuit further comprising:
a sensing capacitor sized substantially smaller than said storage capacitor;
a biasing resistor connected in series with said sensing capacitor; and
a sensing terminal between said sensing capacitor and said biasing resistor for permitting measurement of voltage across said biasing resistor.

5. A bipolar power management circuit for operating multiple magnetic repulsion punches comprising:
a storage capacitor;
means for charging said storage capacitor to alternating polarities;
a plurality of inductive loads comprising operating coils of said magnetic repulsion punches and disposed in a closely spaced array;
means for selectively and temporarily coupling each of said plurality of inductive loads to said storage capacitor for forming a resonant circuit therewith, thereby causing said storage capacitor to discharge and a high amplitude current pulse to flow in said resonant circuit and operating each magnetic repulsion punch in sequence, said means for selectively and temporarily coupling including:
a pair of silicon controller rectifiers (SCRs) for each of said inductive loads coupled mutually in parallel and in opposite polarity to each other and together coupled in series with one of said inductive loads; and
a pair of balanced triggering circuits for each pair of SCRs, for causing one SCR of said pair of SCRs to conduct, thereby forming said resonant circuit with each said inductive load in sequence including:
two operating circuits, each powered from opposite legs of said storage capacitor and coupled in parallel to said storage capacitor, each of said operating circuits further having:
  a triggering signal path coupled to one SCR of said pair of SCRs;

a first isolating means coupled in said triggering signal path between said operating circuit and said one SCR;

a second isolating means coupled in series with said operating circuit and a leg of said storage capacitor opposite a leg from which said operating circuit is powered; and two enabling circuits powered from a low voltage source, each said enabling circuit coupled to one of said operating circuits, for responding to an enabling signal received by both balanced triggering circuits and for causing said operating circuit to emit a triggering signal to said one SCR if said storage capacitor is charged at a polarity like that of said operating circuit.

6. A bipolar management circuit for operating multiple magnetic repulsion punches comprising:

a storage capacitor;

means for charging said storage capacitor to alternating polarities, including;

a rectified power supply;

a pair of charging circuits, each of said charging circuits coupled in series with said storage capacitor and said rectified power supply and coupled in parallel with and in opposite polarity to the polarity of the other of said pair of charging circuits said charging circuits coupled to said storage capacitor through a pair of SCRs for each said charging circuit having like polarity, each SCR of said pair of SCRs further coupled in series with opposing legs of said storage capacitance, each pair of SCRs further coupled in polarity opposite that of said pair of SCRs for said other charging circuit; and a triggering circuit for each pair of SCRs in said charging circuits for causing said SCRs in selected one of said charging circuits to conduct in response to a control signal for charging said storage capacitor to alternating polarities;

a plurality of inductive loads comprising operating coils of said magnetic repulsion punches and disposed in a closely spaced array;

means for selectively and temporarily coupling each of said plurality of inductive loads to said storage capacitor for forming a resonant circuit therewith, thereby causing said storage capacitor to discharge and a high amplitude current pulse to flow in said resonant circuit and operating each magnetic repulsion punch in sequence.

* * * * *